United States Patent [19]

[11] 3,862,859

Ettenberg et al.

[45] Jan. 28, 1975

[54] METHOD OF MAKING A SEMICONDUCTOR DEVICE

[75] Inventors: Michael Ettenberg, Freehold, N.J.; Stephen Lee Gilbert, Newtown, Pa.

[73] Assignee: RCA Corporation, New York, N.Y.

[22] Filed: July 5, 1973

[21] Appl. No.: 376,545

Related U.S. Application Data

[63] Continuation-in-part of Ser. No. 216,376, Jan. 10, 1972, abandoned.

[52] U.S. Cl. .............. 117/215, 117/201, 117/106 A, 148/171, 148/172, 148/173, 148/175, 252/62.3 E, 252/62.3 GA, 357/30

[51] Int. Cl. .......... B44d 1/16, H01l 7/36, H01l 7/38

[58] Field of Search ................................ 148/171-5; 117/201, 106 A, 215; 252/62.3 GA; 317/235 N

[56] References Cited

UNITED STATES PATENTS

| | | | |
|---|---|---|---|
| 3,309,553 | 3/1967 | Kroemer | 317/235 R |
| 3,322,575 | 5/1967 | Ruehrwein | 148/175 X |
| 3,565,702 | 2/1971 | Nelson | 148/172 |
| 3,696,262 | 10/1972 | Antypas | 148/171 X |
| 3,729,348 | 4/1973 | Saul | 148/172 |
| 3,741,825 | 6/1973 | Lockwood et al. | 148/171 |
| 3,766,447 | 10/1973 | Mason | 148/175 X |
| 3,783,009 | 1/1974 | Tramposch | 148/175 X |

OTHER PUBLICATIONS

Saul, J. Electrochemical Society: Solid State Science, Vol. 115, No. 11, Nov. 1968, pp. 1184-1190.

*Primary Examiner*—G. T. Ozaki
*Attorney, Agent, or Firm*—G. H. Bruestle; D. S. Cohen

[57] ABSTRACT

A semiconductor device including a substrate, a first body of a semiconductor material epitaxially deposited on the surface of the substrate and a second body of a semiconductor material epitaxially deposited on the first body. The first body is deposited so as to include a plurality of superimposed epitaxial layers having growth interfaces between adjacent layers so that each of the layers has fewer crystal dislocations than the adjacent layer which is closer to the substrate and the layer adjacent the second body has the fewest crystal dislocations. The second body is of a semiconductor material which has a crystal lattice which substantially matches the crystal lattice of the semiconductor material of the first body.

4 Claims, 1 Drawing Figure

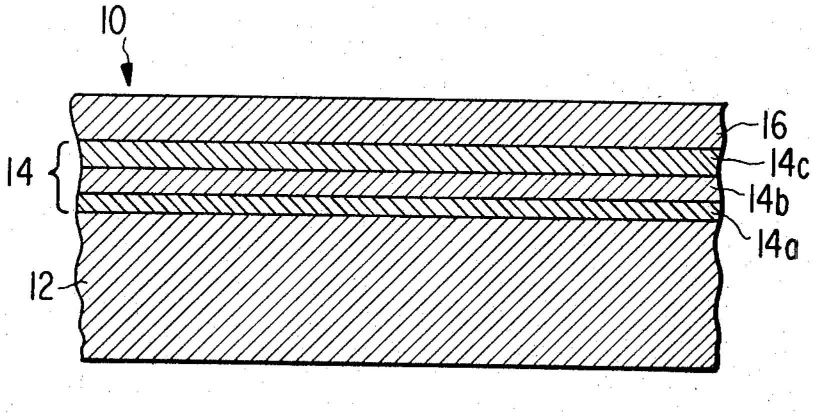
10
16
14
14c
14b
14a
12

METHOD OF MAKING A SEMICONDUCTOR DEVICE

BACKGROUND OF THE INVENTION

This is a continuation-in-part of our application Ser. No. 216,376, filed Jan. 10, 1972, now abandoned.

The present invention relates to a method of making a semiconductor device of the type including an epitaxial layer of single crystalline semiconductor material on a substrate. More particularly, the present invention relates to a method of making such a semiconductor device wherein the epitaxial layer has a minimum amount of dislocations which may result from a difference in the crystal lattice of the epitaxial layer and the substrate.

Many types of semiconductor devices include a layer of a single crystalline semiconductor material epitaxially deposited on a substrate with the active portion of the device being in the epitaxial layer. The substrate may be either an insulating material which is capable of nucleating the epitaxial growth of the semiconductor material, such as sapphire or spinel, or a body of a single crystalline semiconductor material. A problem with such devices arises when the crystalline lattice of the semiconductor material of the epitaxial layer is substantially different from the crystalline lattice of the material of the substrate. When the epitaxial layer is deposited on the substrate, a substantial mismatch in the crystalline lattice of the materials of the epitaxial layer and the substrate causes dislocations in the crystalline structure of the epitaxial layer at the interface with the substrate. Such dislocations have a tendency to propagate through the epitaxial layer and can adversely affect the electrical characteristics of the device being formed in the epitaxial layer. This same problem can occur when the substrate itself has crystal dislocations in its surface on which the epitaxial layer is deposited. The dislocations in the surface of the substrate will propagate into and sometimes through the epitaxial layer deposited thereon. Therefore, to prevent the formation of the undesirable dislocations it is desirable to use materials for the substrate and the epitaxial layer which have similar crystalline lattices. However, to utilize the properties, physical and/or electrical, of the various semiconductor materials and substrate materials which are available to make a semiconductor device it is not always possible to use materials which have similar crystalline lattices.

SUMMARY OF THE INVENTION

A semiconductor device is made by epitaxially depositing on a substrate a body of a single crystalline semiconductor material having a crystal lattice which is substantially different from that of the substrate. The body is deposited by depositing in sequence on the substrate separate superimposed layers of the semiconductor material. Each of the layers is deposited from a source of the semiconductor material with the substrate being intermittently removed from and replaced in contact with the source to provide a growth interface between adjacent layers.

BRIEF DESCRIPTION OF THE DRAWING

The FIGURE of the drawing is a cross-sectional view of one form of a semiconductor device made by the method of the present invention.

DETAILED DESCRIPTION

Referring to the drawing, a form of the semiconductor device made by the method of the present invention is generally designated as 10. The semiconductor device 10 includes a substrate 12, a first body 14 of single crystalline semiconductor material on a surface of the substrate 12, and a second body 16 of a single crystalline semiconductor material on the first body 14. The substrate 12 may be of any of the well known materials which will nucleate the epitaxial growth of a single crystalline semiconductor material thereon. For example, the substrate 12 may be an insulating material, such as sapphire or spinel, or a single crystal semiconductor material, such as silicon, germanium, a group III–V compound or alloy thereof, or a group II–VI compound. The second body 16 is of any single crystal semiconductor material which has the desired characteristics and may be of a material which has a crystal lattice substantially different from the crystal lattice of the substrate 12. The first body 14 is of any single crystal semiconductor material which has a crystal lattice which substantially matches the crystal lattice of semiconductor material of the second body 16. By substantially matching crystal lattice it is meant that at the interface between the two semiconductor material bodies, the atom spacing in the crystals of each of the semiconductor materials is substantially the same. For example, the following pairs of semiconductor materials have substantially matching crystal lattices:

InAs – GaSb
ZnSe – GaAs
$In_xAl_{1-x}As$ – $In_xGa_{1-x}As$
AlSb – GaSb
$Al_xGa_{1-x}As$ – GaAs
BN – AlAS

Thus, if the desired material for the second body 16 is of one of the semiconductor materials of any one of these pairs, the first body 14 can be of the other semiconductor material of the pair. However, the semiconductor materials which can be used for the first and second bodies 14 and 16 are not limited to the above pairs, but any of the well known semiconductor materials whose crystal lattices are known can be matched for use for the bodies 14 and 16.

As shown in the drawing, the first body 14 is made up of a plurality of superimposed epitaxial layers **14*a*, 14*b*, and 14*c* with a growth interface between adjacent layers. By "growth interface" it is meant that when the epitaxial layers 14*a*, 14*b*, and 14*c* are grown or deposited on the substrate 12 to form the first body 14, there is an interruption in the growth process between each of the adjacent layers. It has been found that by providing a growth interface between each of the adjacent layers 14*a*, 14*b*, and 14*c* of the first body 14, each of the layers will have fewer crystalline dislocations than the previous layer. Thus, if the first epitaxial layer 14*a* has crystalline dislocations formed therein as a result of either a substantial difference between the crystal lattice of the materials of the substrate 12 and the first body 14 or crystal dislocations in the surface of the substrate 12, the second epitaxial layer 14*b* will contain fewer crystal dislocations than the first epitaxial layer 14*a* and the third epitaxial layer 14*c* will contain fewer crystal dislocations than the second epitaxial layer 14*b*. Therefore, by forming the first body 14 of a sufficient number of the epitaxial layers having growth interfaces therebetween the final epitaxial layer will have a minimum amount of crystal dislocations. Thus, the second body 16 applied to the first body 14 will be substantially freer of crystal dislocations so as to provide the semiconductor device 10 with an active region which has good electrical properties. The number of epitaxial layers required for the first body 14 will vary depending on the lattice mismatch between the material of the first body 14 and the material of the substrate 12, the crystal perfection at the surface of the substrate 12, and the crystal perfection required for the second body 16 which forms the active portion of the semi-conductor device. The closer the lattice match between the materials of the first body 14 and the substrate 12 or the more highly the crystal perfection of the substrate 12, the fewer the number of epitaxial layers will be required for the first body 14 to obtain a second body 16 which is substantially free of crystal dislocations. Although in general, it is preferable to form the first body 14** of two or more epitaxial layers, a single epitaxial layer may, under the proper conditions, be sufficient.

To make the semiconductor device 10 in accordance with the method of the present invention, the layers 14*a*, 14*b* and 14*c* of the first body 14 are epitaxially deposited in succession on the substrate 12 using any well known technique, such as either vapor phase epitaxy or liquid phase epitaxy. For vapor phase epitaxy the substrate 12 is placed in a chamber into which is passed a gas containing the element or elements of the particular semiconductor material. The chamber is heated to a temperature at which the gas reacts to form the semiconductor material which deposits on the surface of the substrate. For example, an epitaxial layer of silicon can be deposited from a mixture of either silane, or silicon tetrachloride and hydrogen. The group III–V compound semiconductor materials and alloys thereof can be deposited in the manner described in the article of J. J. Tietjen and J. A. Amick entitled "The Preparation and Properties of Vapor-Deposited Epitaxial $GaAs_{1-x}P_x$ using Arsine and Phosphine," JOURNAL ELECTRO-CHEMICAL SOCIETY, Vol. 113, p. 724, 1966. The group II-VI compound semiconductor materials can be deposited in the manner described in the article by W. M. Yim et al, entitled "Vapor Growth of (II–VI) - (III–IV) Quaternary Alloys and Their Properties," RCA REVIEW, Vol. 31, No. 4, page 662, December 1970. The deposition process is first carried out for a time period long enough to deposit the first epitaxial layer 14*a* and is then stopped either by stopping the flow of the gas through the chamber or by removing the substrate from the chamber. The deposition process is then started again either by resuming the flow of the gas through the chamber or by replacing the substrate into the chamber to deposit the second epitaxial layer 14*b* on the first epitaxial layer 14*a*. This break in the deposition process results in the desired growth interface between the epitaxial layers 14*a* and 14*b*. Similarly, after the second epitaxial layer 14*b* is deposited, the deposition process is stopped and restarted to deposit the third epitaxial layer 14*c* with a growth interface between the second and third epitaxial layers 14*b* and 14*c*.

To deposit each of the epitaxial layers 14*a*, 14*b* and 14*c* of the first body 14 by liquid phase epitaxy, a surface of the substrate 12 is brought into contact with a solution of the semiconductor material dissolved in a molten metal solvent, the solution is cooled so that a portion of the semiconductor material in the solution precipitates and deposits on the substrate as an epitaxial layer, and the remainder of the solution is removed from the substrate. U.S. Pat. No. 3,565,702 to H. Nelson issued Feb. 23, 1971 entitled "Depositing Successive Epitaxial Semiconductive Layers From The Liquid Phase" describes a method and apparatus which is suitable for depositing the epitaxial layers in succession. The apparatus includes a furnace boat of a refractory material having a plurality of spaced wells in its top surface, a slide of a refractory material movable in a passage which extends across the bottoms of the wells so that the top surface of the slide forms the bottom surface of the wells, and a substrate receiving recess in the top surface of the slide.

Using this apparatus for depositing the epitaxial layers of the first body 14, separate mixtures of the semiconductor material and the metal solvent are provided in each of three wells in the furnace boat and the substrate 12 is placed in the recess in the slide. The furnace boat and its contents are placed in a furnace and heated to a temperature at which the metal solvent becomes molten and the semiconductor material dissolves in the solvent. The slide is then moved to carry the substrate 12 into the first well so that the surface of the substrate is in contact with the heated solution in the first well. The temperature of the furnace is then lowered to cool the solution in the first well. This causes some of the semiconductor material in the solution to precipitate out and deposit on the substrate 12 to form the first epitaxial layer 14*a*. The slide is then moved to carry the substrate 12 with the first epitaxial layer 14a thereon into the second well where the first epitaxial layer 14*a* is in contact with the solution in the second well. The temperature of the furnace is further lowered to cool the solution in the second well. This causes some of the semiconductor material in the solution to precipitate out and deposit on the first epitaxial layer 14*a* to form the second epitaxial layer 14*b*. The slide is again moved to carry the substrate 12 with the first and second epitaxial layers 14*a* and 14*b* thereon into the third well where the second epitaxial layer 14*b* contacts the solution in the third well. The temperature of the furnace is lowered further to cool the solution. This causes some of the semiconductor material in the solution to precipitate out and deposit on the second epitaxial layer 14*b* to form the third epitaxial layer 14*c*. The slide is then again moved to carry the substrate 12 with the three epitaxial layers thereon from the third well. The moving of the substrate 12 from the first well to the second well and from the second well to the third well interrupts the epitaxial deposition so as to provide the desired growth interfaces between the adjacent epitaxial layers of the first body 14.

To provide the desired growth interface between the adjacent layers of the first body 14 it is not necessary that all of the layers be deposited by the same technique, i.e., either all by vapor phase epitaxy or all by liquid phase epitaxy. If desired some of the layers can be deposited by vapor phase epitaxy and others by liquid phase epitaxy. Also, it is not necessary that all of the layers of the first body 14 be deposited immediately in succession but a time interval can be provided between the deposition of each succeeding layer. However, it is desirable that the growth interfaces between the layers be formed by completely removing the substrate from the source of the deposition material and then reinserting the substrate into the source of the deposition material for the next layer. We have found that forming the growth interfaces by completely removing the substrate from the deposition material has certain advantages over merely stopping the growth while retaining the substrate in contact with the deposition material, particularly when using liquid phase epitaxy. One advantage is that it provides a better defined growth interface between the layers which results in a greater reduction in the crystal dislocations from layer to layer. When using liquid phase epitaxy, another advantage is that it permits achieving a more uniform composition across the entire thickness of the first body 14, particularly when the first body is of a semiconductor material composed of three or more elements. When depositing a semiconductor material composed of three or more elements by liquid phase epitaxy, the ratio of the elements in the deposited layer varies as the thickness of the layer increases because of the solubility characteristics of the material. Thus, if all of the layers of the first body 14 are deposited from a single solution, there can be a large variation in the composition of the body across its thickness. However, by depositing the layers from separate solutions the composition of the layers can be maintained more uniform to achieve a more uniform composition across the entire thickness of the body.

After the epitaxial layers 14*a*, 14*b* and 14*c* of the first body 14 are deposited on the substrate 12, the second body 16 is provided on the first body 14. The second body 16 can be epitaxially deposited on the first body 14 by any well known epitaxial technique, such as by the vapor phase epitaxy or liquid phase epitaxy techniques previously described with regard to the first body 14. If the second body 16 as well as the first body 14 is deposited by liquid phase epitaxy, this can be accomplished in the same furnace boat used to deposit the first body 14. To do this, a solution of the semiconductor material of the second body 16 dissolved in a molten metal solvent is provided in a well of the furnace boat adjacent the last well used for the deposition of the first body 14. After the third epitaxial layer 14*c* of the first body 14 is deposited on the substrate 12, the slide is moved to carry the substrate with the epitaxial layers of the first body thereon into the well containing the solution for the second body 16. The temperature of the furnace is lowered to cool this solution. This causes some of the semiconductor material in the solution to precipitate out and deposit on the surface of the third epitaxial layer 14*c* to form the second body 16. The slide is then again moved to carry the substrate out of the well.

Thus, there is provided by the present invention a method of making a semiconductor device 10 having a substrate a body 16 of semiconductor material which is the active portion of the semiconductor device and which is substantially free or has a minimum amount of crystal dislocations even though the materials of the semiconductor body and the substrate have substantially different crystalline lattices or the substrate has substantial crystal dislocations in its surface. The semiconductor device 10 can be used to form any desired type of device. For example, by providing one or more PN junctions in the second body 16, one or more diodes, transistors or combinations thereof can be formed in the second body. Also, by making the second body 16 of a group III–V compound semiconductor material or alloy of such compounds and providing one or more PN junctions therein, there can be provided a light emitting diode or an array of a plurality of such light emitting diodes. In addition, the semiconductor device can be made as a photocathode by making the substrate of a transparent material, the second body of a group III–V compound semiconductor material and sensitizing the surface of the second body with a low work function electropositive material, such as cesium and oxygen.

What we claim is:

1. A method of making a semiconductor layered structure comprising the steps of epitaxially depositing on a substrate a first body of a single crystalline semiconductor material having a crystal lattice substantially different from that of the substrate by depositing in sequence on the substrate separate superimposed layers of the semiconductor material of substantially the same composition, each layer being deposited from a source of the semiconductor material with the substrate being intermittently removed from and replaced in contact with the source to provide a growth interface between adjacent layers, and depositing a second body of a semiconductor material on said first body, the semiconductor material of said second body being of a different composition than the composition of the first body but having a crystal lattice which substantially matches the crystal lattice of the first body.

2. The method in accordance with claim 1 wherein the layers of the body are deposited by vapor phase epitaxy wherein the source of the semiconductor material for each layer is a gas containing the element or elements of the semiconductor material.

3. The method in accordance with claim 1 wherein the layers of the body are deposited by liquid phase epitaxy wherein the source of the semiconductor material is a solution of the semiconductor material in a solvent.

4. The method in accordance with claim 3 wherein there is a separate solution containing the semiconductor material for each layer and the substrate is moved from one solution to the next with a layer being deposited from each solution.

* * * * *